United States Patent
Kurihara et al.

(10) Patent No.: US 8,940,571 B2
(45) Date of Patent: Jan. 27, 2015

(54) THERMOELECTRIC CONVERSION ELEMENT

(71) Applicant: Fujitsu Limited, Kawasaki-shi, Kanagawa (JP)

(72) Inventors: Kazuaki Kurihara, Kawasaki (JP); Masaharu Hida, Kawasaki (JP); Kazunori Yamanaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/933,676

(22) Filed: Jul. 2, 2013

(65) Prior Publication Data

US 2013/0284229 A1 Oct. 31, 2013

Related U.S. Application Data

(60) Division of application No. 13/150,399, filed on Jun. 1, 2011, now Pat. No. 8,501,518, which is a continuation of application No. PCT/JP2008/073826, filed on Dec. 26, 2008.

(51) Int. Cl.
*H01L 21/00* (2006.01)
*H01L 35/32* (2006.01)
*H01L 35/34* (2006.01)

(52) U.S. Cl.
CPC ............... *H01L 35/32* (2013.01); *H01L 35/34* (2013.01)
USPC .................................. 438/54; 257/E21.088

(58) Field of Classification Search
CPC ......... H01L 35/32; H01L 35/30; H01L 35/34; H01L 35/00; H01L 35/16; H01L 35/10
USPC .......... 257/431, 930, E21.088; 136/201, 230; 438/54

See application file for complete search history.

(56) References Cited

U.S. PATENT DOCUMENTS

| 4,465,895 | A | 8/1984 | Verner et al. |
| 5,318,743 | A | 6/1994 | Toki et al. |
| 6,025,554 | A | 2/2000 | Macris |
| 6,347,521 | B1 | 2/2002 | Kadotani et al. |

(Continued)

FOREIGN PATENT DOCUMENTS

| JP | 59-222975 A | 12/1984 |
| JP | 01-194479 A | 4/1989 |

(Continued)

OTHER PUBLICATIONS

International Search Report of PCT/JP2008/073826, date of mailing Mar. 31, 2009.

(Continued)

*Primary Examiner* — Duy T Nguyen
(74) *Attorney, Agent, or Firm* — Westerman, Hattori, Daniels & Adrian, LLP

(57) ABSTRACT

P-type semiconductor sheets and n-type semiconductor sheets formed by mixing a powder of semiconductor material, a binder resin, a plasticizer, and a surfactant are prepared. In addition, separator sheets formed by mixing a resin such as PMMA and a plasticizer are prepared. Through holes are formed in each of the separator sheets and then filled with a conductive material. Thereafter, the p-type semiconductor sheet, the separator sheet, the n-type semiconductor sheet and the separator sheet are stacked. The resultant laminated body is cut into a predetermined size and then subjected to a baking process.

3 Claims, 13 Drawing Sheets

(56) References Cited

U.S. PATENT DOCUMENTS

| | | | |
|---|---|---|---|
| 6,841,476 B1 * | 1/2005 | Nakamura | 438/678 |
| 6,894,215 B2 | 5/2005 | Akiba | |
| 2005/0178424 A1 * | 8/2005 | Yotsuhashi et al. | 136/201 |
| 2006/0096692 A1 * | 5/2006 | Sato et al. | 156/89.11 |

FOREIGN PATENT DOCUMENTS

| | | | |
|---|---|---|---|
| JP | 03-076278 A | | 4/1991 |
| JP | 06-029581 A | | 2/1994 |
| JP | 08-306967 A | | 11/1996 |
| JP | 2001-189497 A | | 7/2001 |
| JP | 2001-217469 A | | 8/2001 |
| JP | 2001217469 | * | 8/2001 |
| JP | 2003-174203 A | | 6/2003 |
| JP | 2003-298128 A | | 10/2003 |
| JP | 2004-221375 A | | 8/2004 |
| JP | 2004-281928 A | | 10/2004 |
| JP | 2006-086510 A | | 3/2006 |
| JP | 2006-165273 A | | 6/2006 |

OTHER PUBLICATIONS

Japanese Office Action dated Feb. 19, 2013, corresponding to Japanese Application No. 2010-543730.

Japanese Office Action dated May 21, 2013, corresponding to Japanese Application No. 2010-543730.

* cited by examiner

THERMOELECTRIC CONVERSION ELEMENT

CROSS-REFERENCE TO RELATED APPLICATIONS

This application is a divisional of application Ser. No. 13/150,399(now, Pat. No. 8,501,518), filed Jun.1, 2011, which is a continuation of the prior International Patent Application No. PCT/JP2008/073826, filed Dec. 26, 2008, the entire contents of which are incorporated herein by reference.

FIELD

The embodiments discussed herein relate to a method of manufacturing a thermoelectric conversion element such as a thermoelectric generating element and a Peltier element, and also to a structure of a thermoelectric conversion element.

BACKGROUND

Thermoelectric conversion elements include thermoelectric generating elements, which generate electricity using heat, and Peltier elements, which transfer heat using electricity. The basic structures of the thermoelectric generating elements and Peltier elements are the same. FIG. 1 illustrates an example of a thermoelectric conversion element.

A thermoelectric conversion element 100 has a structure in which a plurality of p-type semiconductor blocks 101 and a plurality of n-type semiconductor blocks 102 are held between two heat transfer plates 104a and 104b. The p-type semiconductor blocks 101 and the n-type semiconductor blocks 102 are alternately arranged and connected to each other in series by conductors 103 provided between the heat transfer plate 104a and the semiconductor blocks 101 and 102, and also between the heat transfer plate 104b and the semiconductor blocks 101 and 102. In addition, electrodes 106a and 106b are provided respectively at both edges of an aggregate of the p-type semiconductor blocks 101 and the n-type semiconductor blocks 102 connected in series.

When a current is caused to flow through the p-type semiconductor blocks 101 and the n-type semiconductor blocks 102 by connecting the electrodes 106a and 106b to a power supply, heat is transferred from the heat transfer plate 104a on one side to the heat transfer plate 104b on the other side by the Peltier effect. Meanwhile, when a temperature difference is generated between the two heat transfer plates 104a and 104b, a potential difference occurs between the p-type semiconductor blocks 101 and the n-type semiconductor blocks 102 by the Seebeck effect, and the current is extracted from the electrodes 106a and 106b.

Patent Document 1: Japanese Laid-open Patent Publication No. 2001-217469
Patent Document 2: Japanese Laid-open Patent Publication No. 2001-189497
Patent Document 3: Japanese Laid-open Patent Publication No. 2006-165273

In recent years, various electronic devices have been required to achieve a reduction in size and an improvement in performance. Thus, thermoelectric conversion elements to be mounted in these electronic devices have also been required to be further reduced in size and highly integrated.

SUMMARY

According to one aspect, a method of manufacturing a thermoelectric conversion element includes: preparing a plurality of p-type semiconductor sheets each containing a powder of p-type semiconductor material, and a plurality of n-type semiconductor sheets each containing a powder of n-type semiconductor material; preparing a plurality of separator sheets each including through holes provided at a predetermined pitch, the though holes being filled with a conductive material; stacking the p-type semiconductor sheets and the n-type semiconductor sheets alternately with the separator sheets each interposed in between to form a laminated body; obtaining a laminated body unit by cutting the laminated body at positions of the through holes of the separator sheets; baking the laminated body unit to obtain a semiconductor block aggregate of a structure in which p-type semiconductor blocks and n-type semiconductor blocks are alternately connected with electrodes; and attaching a pair of heat transfer plates to the semiconductor block aggregate.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

Hereinafter, embodiments are described with reference to the accompanying drawings.

(First Embodiment)

FIGS. 2A to 7B are schematic diagrams illustrating a method of manufacturing a thermoelectric conversion element according to a first embodiment.

Figure 1:
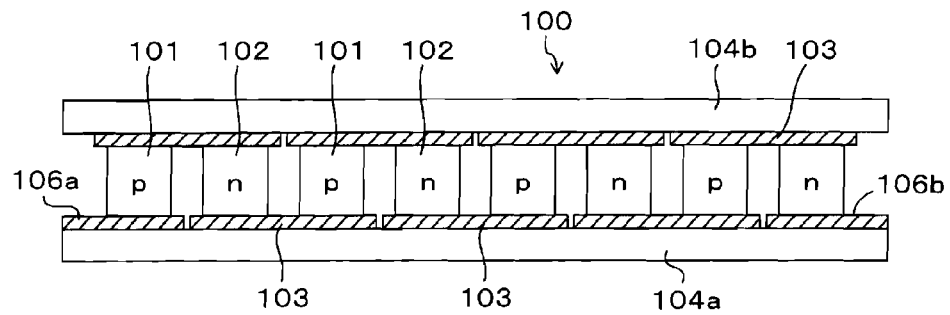
FIG. 1 is a schematic diagram illustrating an example of a thermoelectric conversion element.
Figure 2A:
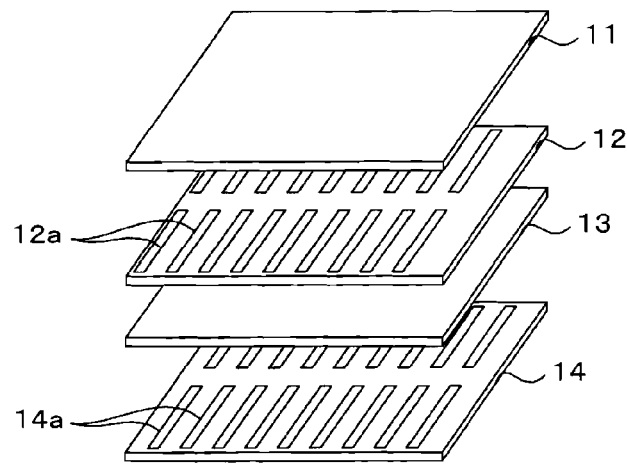
FIGS. 2A and 2B are schematic diagrams illustrating a method of manufacturing a thermoelectric conversion element according to a first embodiment (part 1)
Figure 2B:
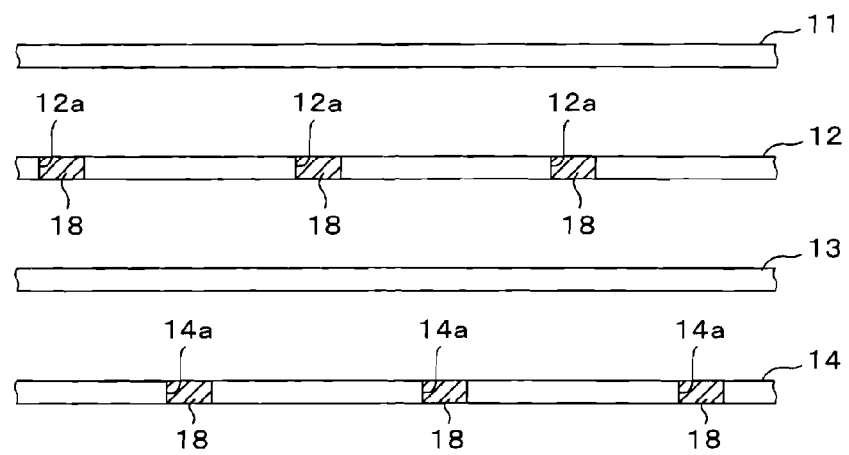

Firstly, as illustrated in a perspective view of FIG. 2A and a cross-sectional view of FIG. 2B, a p-type semiconductor green sheet 11, an n-type semiconductor green sheet 13, and resin sheets (separator sheets) 12 and 14 are formed.

The semiconductor green sheet 11 or 13 is formed by mixing, for example, a powder of p-type semiconductor material or a powder of n-type semiconductor material, a binder resin, a plasticizer and a surfactant. In the first embodiment, an assumption is made that each of the semiconductor green sheets 11 and 13 has a square shape with each side being 15 cm and has a thickness equal to 40 μm.

A powder of $(BiO_{0.25}Sb_{0.75}) (TeO_{0.93}Se_{0.07})$ may be used as the powder of p-type semiconductor material, for example. A powder of $(Bi_2Te_3)_{0.975} (Bi_2Se_3)_{0.025}$ may be used as the powder of n-type semiconductor material, for example.

The resin sheets 12 and 14 are formed by mixing a resin such as polymethylmethacrylate (PMMA) and a plasticizer, for example. Each of the resin sheets 12 and 14 has a square shape with each side being 15 cm as in the case of the semiconductor green sheets 11 and 13, and has a thickness equal to 30 μm.

As illustrated in FIG. 2B, through holes 12a are formed in the resin sheet 12 and through holes 14a are formed in the resin sheet 14. In addition, the through holes 12a and 14a are filled with a conductive paste 18. The through holes 12a and 14a are each formed with a width of 0.1 mm and a length of 12 mm, for example, and are arranged at a pitch of 6.9 mm in the wide direction, for example. However, the through holes 12a of the resin sheet 12 are formed at positions shifted by half a pitch from the through holes 14a of the resin sheet 14.

Figure 3A:
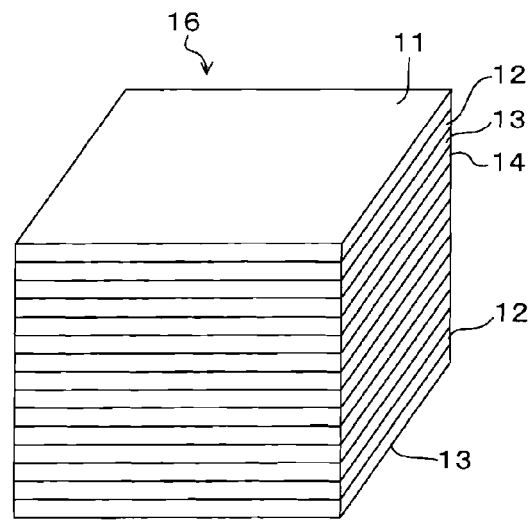
FIGS. 3A and 3B are schematic diagrams illustrating the method of manufacturing a thermoelectric conversion element according to the first embodiment (part 2)
Figure 3B:
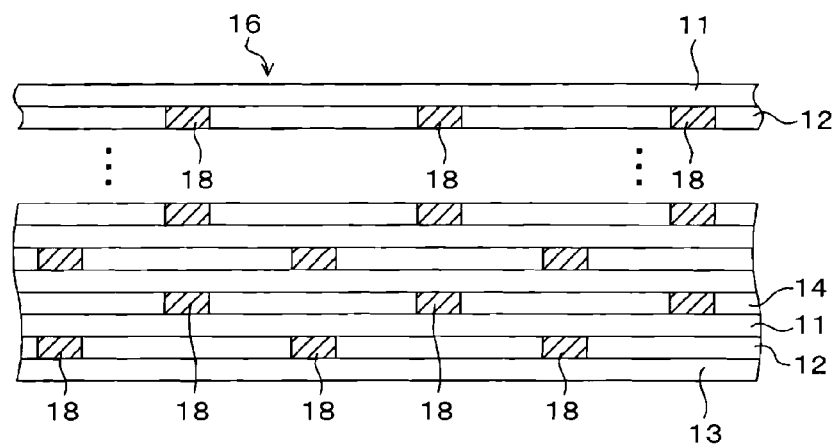

Next, as illustrated in a perspective view of FIG. 3A and a cross-sectional view of FIG. 3B, the p-type semiconductor green sheet 11, the resin sheet 12, the n-type semiconductor green sheet 13, and the resin sheet 14 are repeatedly stacked on one another from above in this order to form a laminated body 16.

Next, the laminated body 16 is hot pressed for 30 minutes at a temperature of 110° C., for example, to integrate the stacked p-type semiconductor green sheets 11, resin sheets 12, n-type semiconductor green sheets 13, and resin sheets 14 into a single body. Thereafter, as illustrated in a perspective view of FIG. 4A and a cross-sectional view of FIG. 4B, the laminated body 16 is cut by a dicing saw at the positions of the through holes 12a and 14a (at the positions indicated by dashed lines in FIG. 4B), for example. Thus, stripe-shaped laminated bodies 16 are obtained. Thereafter, each of the stripe-shaped laminated bodies 16 is cut to obtain a laminated body unit in a desired size (1 cm×1 cm, for example).

Figure 4A:
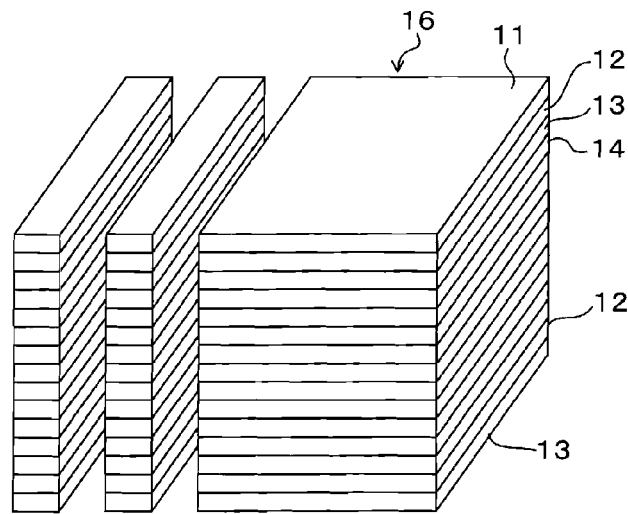
FIGS. 4A and 4B are schematic diagrams illustrating the method of manufacturing a thermoelectric conversion element according to the first embodiment (part 3)
Figure 4B:
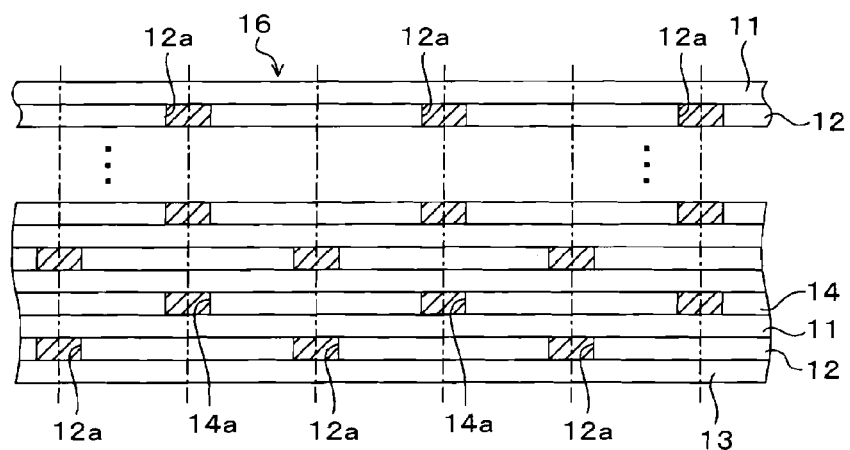
Figure 5A:
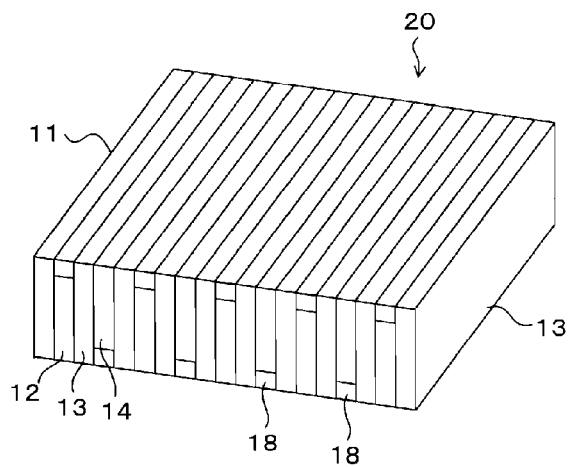
FIGS. 5A and 5B are schematic diagrams illustrating the method of manufacturing a thermoelectric conversion element according to the first embodiment (part 4)
Figure 5B:
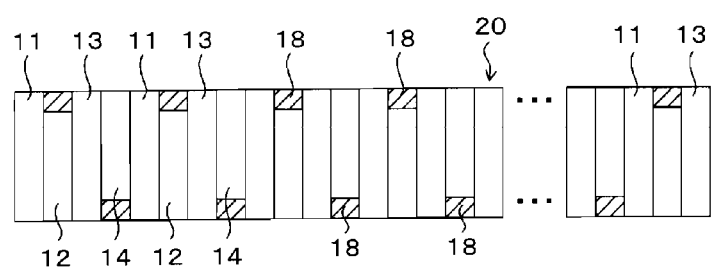

FIG. 5A is a perspective view of a laminated body unit 20, and FIG. 5B is a cross-sectional view of the same. Here, the height direction of FIGS. 4A and 4B is illustrated as the lateral direction in FIGS. 5A and 5B. As illustrated in FIGS. 5A and 5B, the rein sheet 12 or 14 is interposed between the p-type semiconductor green sheet 11 and the n-type semiconductor green sheet 13 in the laminated body unit 20. In addition, the conductive paste 18 filled in each of the through holes 12a or 14a of the resin sheet 12 or 14 is interposed between upper portions or lower portions of the p-type semiconductor green sheet 11 and the n-type semiconductor green sheet 13 adjacent to each other.

Next, the laminated body unit 20 is put in a vacuum degreasing baking furnace and then is sufficiently degreased by increasing the temperature under a reduced pressure equal to or smaller than 0.1 atmosphere, for example. Thereafter, the laminated body unit 20 is baked for one hour at a temperature of 500° C. under a reduced pressure of equal to or smaller than 1 Torr (about $1.33 \times 10^2$ Pa), for example.

Figure 6A:
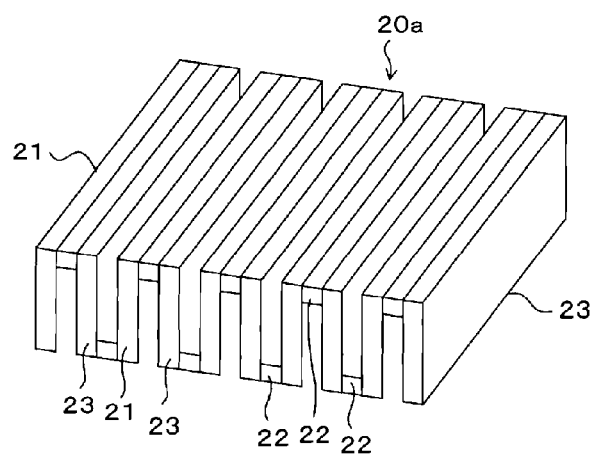
FIGS. 6A and 6B are schematic diagrams illustrating the method of manufacturing a thermoelectric conversion element according to the first embodiment (part 5)
Figure 6B:
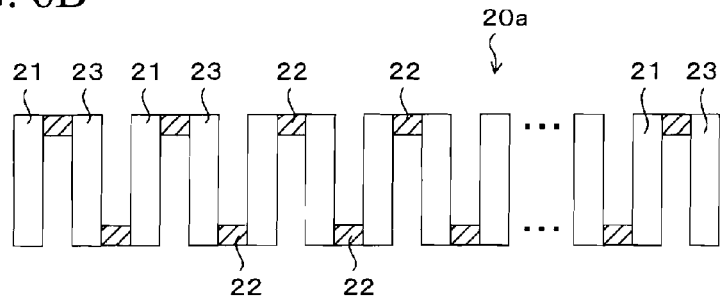

In this baking process, the p-type semiconductor green sheets 11 are baked and thus become p-type semiconductor blocks 21 and the n-type semiconductor green sheets 13 are baked and thus become n-type semiconductor blocks 23 as illustrated in a perspective view of FIG. 6A and a cross-sectional view of FIG. 6B. In addition, the polymer forming the resin sheets 12 and 14 thermally decomposes and then is lost in this baking process. Furthermore, the conductive paste 18 filled in each of the through holes 12a and 14a of the resin sheets 12 and 14 is baked and thus becomes an electrode 22. Specifically, the laminated body unit 20 becomes a semiconductor block aggregate 20a of a structure in which the p-type semiconductor blocks 21 and the n-type semiconductor blocks 23 are alternately and electrically connected with each other by the electrodes 22.

Figure 7A:
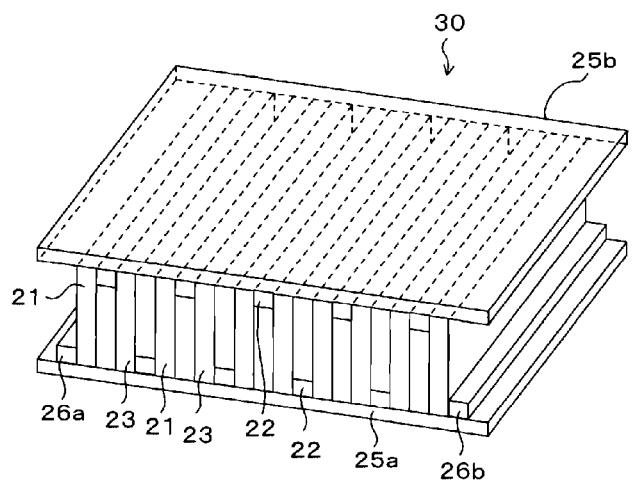
FIGS. 7A and 7B are schematic diagrams illustrating the method of manufacturing a thermoelectric conversion element according to the first embodiment (part 6)
Figure 7B:
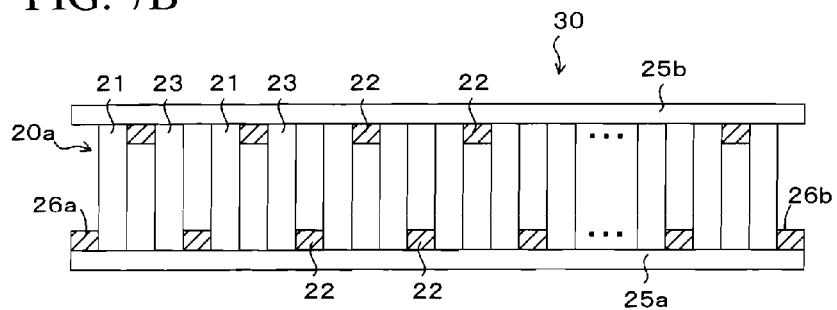

Next, as illustrated in a perspective view of FIG. 7A and a cross-sectional view of FIG. 7B, heat transfer plates 25a and 25b are bonded respectively to the top and bottom portions of the semiconductor block aggregate 20a. A material having a high thermal conductivity is preferably used to form the heat transfer plates 25a and 25b. However, at least the surface of each of the heat transfer plates 25a and 25b, which is in contact with the semiconductor block aggregate 20a, preferably has insulating properties. An insulating sheet may be provided between the semiconductor block aggregate 20a and each of the heat transfer plates 25a and 25b.

Next, extraction electrodes 26a and 26b are formed respectively at both edges of the semiconductor block aggregate 20a by use of a silver paste or the like. Thus, a thermoelectric conversion element 30 is completed.

In the thermoelectric conversion element 30 according to the first embodiment, as illustrated in FIG. 7A, the longitudinal direction of the semiconductor blocks 21 and 23 coincides with the longitudinal direction of the electrodes 22, and the longitudinal direction of the electrodes 22 is orthogonal to the arrangement direction of the semiconductor blocks 21 and 23.

According to the method of manufacturing a thermoelectric conversion element according to the first embodiment, the p-type semiconductor blocks 21 and n-type semiconductor blocks 23 may be reduced in size and may be also arranged with a small pitch. Thus, a small thermoelectric conversion element with high performance may be obtained.

In addition, the laminated body unit 20 is formed in this embodiment, which has a structure in which a large number of p-type semiconductor green sheets 11, n-type semiconductor green sheets 13 and resin sheets 12 and 14 are stacked. Then, the laminated body unit 20 is baked and thus the semiconductor block aggregate 20a having a large number of p-type semiconductor blocks 21 and n-type semiconductor blocks 23 is formed. Thus, a thermoelectric conversion element may be relatively easily manufactured in this embodiment without a need to handle the semiconductor blocks individually.

Furthermore, the semiconductor blocks 21 and 23 and the electrodes 22 are formed simultaneously by the baking process in this embodiment. Thus, the reliability of connection between the semiconductor blocks 21 and 23 and the electrodes 22 is high.

Note that, the semiconductor green sheets 11 and 13, and the resin sheets 12 and 14 may be formed by a known doctor blade method, for example. The doctor blade method may allow manufacturing of a sheet with a thickness of approximately 1 μm. Thus, in a case where the semiconductor green sheets 11 and 13, and the resin sheets 12 and 14 are formed with a thickness smaller than those in the aforementioned example, a further reduction in size and higher integration for the thermoelectric conversion element may be achieved. Meanwhile, when the thickness of each of the semiconductor green sheets 11 and 13 and the resin sheets 12 and 14 exceeds 1 mm, the degree of integration of the p-type semiconductor blocks 21 and the n-type semiconductor blocks 23 becomes low. For this reason, the thickness of each of the semiconductor green sheets 11 and 13 and the resin sheets 12 and 14 is preferably set between 1 µm and 1 mm inclusive.

Hereinafter, the powder of semiconductor material used as the material of the semiconductor green sheets 11 and 13 is described.

Examples of the powder of semiconductor material include a powder of heavy metal based semiconductor material such as BiTe or PbTe, a powder of silicide based semiconductor material such as FeSi or MgSi, a powder of oxide based semiconductor material such as CaCiO or CaMnO. The temperature required for the baking process is determined depending on which powder of semiconductor material is used.

In this embodiment, the p-type semiconductor green sheets 11 and the n-type semiconductor green sheets 13 are simultaneously baked as described above. For this reason, the powders of semiconductor materials are preferably selected in such a way that the temperature set for baking the p-type semiconductor green sheets 11 and the temperature set for baking the n-type semiconductor green sheets 13 become similar to each other.

In a case where a thermoelectric conversion element used at a relatively low temperature (100° C. to 200° C., for example) is manufactured, a BiTe based semiconductor material is preferably used as the material of the semiconductor green sheets 11 and 13. In general, the BiTe based semiconductor material has properties that its melting point is low and the material is easily oxidized. For this reason, when the BiTe based semiconductor material is selected, the baking process is performed in a non-oxidizing atmosphere or a vacuum at a relatively low temperature (about 500° C., for example).

Meanwhile, in a case where the BiTe based semiconductor material is selected, the temperature set for the baking process is low. Thus, a depolymerizable resin, which decomposes and scatters at a relatively low temperature, is suitable for the resin used for the semiconductor green sheets 11 and 13 and the resin sheets 12 and 14. As an example of such a resin, an acrylic resin such as PMMA and a polystyrene resin are cited.

In a case where the aforementioned BiTe based semiconductor material and depolymerizable resin are selected, during the baking process, a debinding process is performed by taking plenty of time at a temperature between 300° C. to 400° C. at which the resin decomposes and scatters, for example, and thereafter, vacuum baking is performed at a temperature of 500° C., for example. The conductive paste which becomes the electrodes 22 is preferably one which is baked at the aforementioned temperature. Thus, a conductive paste mainly containing Bi is used, for example.

In a case where a thermoelectric conversion element used at a temperature of about 500° C. is manufactured, a silicide based semiconductor material is preferably used as the material of the semiconductor green sheets 11 and 13. When a silicide based semiconductor material is selected, the baking temperature is set relatively higher than the baking temperature set in a case where a BiTe based semiconductor material is selected.

In a case where a silicide based semiconductor material is selected, a depolymerizable resin is suitable for the resin used for the semiconductor green sheets 11 and 13 and the resin sheets 12 and 14. In addition, a conductive paste mainly containing a metal such as Ni, Cu or Ag is preferably used as the conductive paste which becomes the electrodes 22. Note that, the baking process of the semiconductor green sheets 11 and 13 is performed in a vacuum.

Moreover, in a case where a thermoelectric conversion element used at a higher temperature is manufactured, an oxide based semiconductor material is preferably used as the material of the semiconductor green sheets 11 and 13. Selecting an oxide based semiconductor material may enable the baking process to be performed in the atmosphere, and thus eliminates the need for a vacuum device or vacuum chamber. In addition, the baking temperature becomes high in this case, so that there are fewer limitations on the resin to be used for the semiconductor green sheets 11 and 13 and the resin sheet 12 and 14 in this case. As the resin used for the semiconductor green sheets 11 and 13 and the resin sheet 12 and 14 in this case, a general binder resin such as polyvinyl alcohol (PVA) or polyvinyl butyral (PVB) may be used, for example.

In a case where the oxide based semiconductor material and resin are used, not only the baking process, but also the debinding process may be performed in the atmosphere. As the conductive paste which becomes the electrodes 22, a conductive paste mainly containing a noble metal such as Ag or Ag—Pd is preferably used.

Hereinafter, a result obtained by actually manufacturing a thermoelectric conversion element (thermoelectric generating element) according to the manufacturing method of the first embodiment and then examining its electromotive force is described in comparison with a comparative example.

EXAMPLE 1

Firstly, $(BiO_{0.25}Sb_{0.75})(TeO_{0.93}Se_{0.07})$ is prepared as the powder of p-type semiconductor material, and $(Bi_2Te_3)_{0.975}(Bi_2Se_3)_{0.025}$ is prepared as the powder of n-type semiconductor material. Then, the powder of p-type semiconductor material, a binder resin (PMMA), a plasticizer (dibutyl phthalate), and a surfactant (polycarboxylic acid based surfactant) are mixed. Thus, p-type semiconductor green sheets 11 each having a thickness of 40 µm are formed by the doctor blade method.

Likewise, the powder of n-type semiconductor material, a binder resin (PMMA), a plasticizer (dibutyl phthalate), and a surfactant (polycarboxylic acid based surfactant) are mixed. Thus, n-type semiconductor green sheets 13 each having a thickness of 40 µm are formed by the doctor blade method.

Thereafter, the semiconductor green sheets 11 and 13 are subjected to a punching process by use of a punching press. Thus, the semiconductor green sheets 11 and 13 are each formed in a square shape with each side being 15 cm.

Meanwhile, a PMMA resin and a plasticizer (dibutyl phthalate) are mixed. Thus, resin sheets each having a thickness of 30 µm are formed by the doctor blade method. Thereafter, the resin sheets are subjected to a punching process by use of a punching press. Thus, the resin sheets 12 and 14 each having a square shape with each side being 15 cm are formed. Here, the through holes 12a are formed in each of the resin sheets 12 and the through holes 14a are formed in each of the resin sheets 14 during the punching process (refer to FIGS. 2A and 2B). The through holes 12a and 14a are each formed with a width equal to 0.1 mm and a length equal to 12 mm, and are arranged at a pitch of 6.9 mm in the width direction. In addition, the positions of the through holes 12a of the resin sheets 12 are shifted by half a pitch from the through holes 14a of the resin sheets 14.

Thereafter, the through holes 12a of the resin sheets 12 and the through holes 14a of the resin sheets 14 are filled by a screen printing method with a conductive paste mainly containing Sn—Bi.

The p-type semiconductor green sheets 11, the resin sheets 12, the n-type semiconductor green sheets 13, and the resin sheets 14 are stacked in this order repeatedly to form the laminated body 16 (refer to FIGS. 3A and 3B). The number of the p-type semiconductor green sheets 11 and the number of the n-type semiconductor green sheets 13 are set to 112.

Next, the laminated body 16 is hot pressed for 30 minutes at a temperature of 110° C. to integrate the stacked p-type semiconductor green sheets 11, resin sheets 12, n-type semiconductor green sheets 13, and resin sheets 14 into a single body. Thereafter, the laminated body 16 is cut by a dicing saw. Thus, the laminated body unit 20 is obtained (refer to FIGS. 5A and 5B).

Next, the laminated body unit 20 is put in a vacuum degreasing baking furnace, and then, a degreasing process is performed for 48 hours under a reduced pressure equal to or smaller than 0.1 atmosphere by slowly increasing the temperature up to 400° C. while attention is paid to a pressure change. Thereafter, the pressure in the vacuum degreasing baking furnace is set to a pressure equal to or smaller than 1 Torr (about $1.33 \times 10^2$ Pa), and the laminated body unit 20 is baked for one hour at a temperature of 500° C. In this manner, the semiconductor block aggregate 20a of a structure in which the p-type semiconductor blocks 21 and the n-type semiconductor blocks 23 are alternately and electrically connected with each other via the electrodes 22 is obtained (refer to FIGS. 6A and 6B).

Next, the heat transfer plates 25a and 25b made of alumina are bonded respectively to the top and bottom portions of the semiconductor block aggregate 20a by an adhesive (high thermal conductive adhesive). In addition, the extraction electrodes 26a and 26b to be connected respectively to the p-type semiconductor block 21 at one end of the semiconductor block aggregate 20a and the n-type semiconductor block 23 at the other end thereof are formed by a silver paste (refer to FIGS. 7A and 7B).

The thermoelectric conversion element 30 of Example 1 fabricated in the aforementioned manner has a size of 1 cm×1 cm with a thickness of 3 mm, and the number of p-n pairs is 112. When a temperature difference of 50° C. is generated between the heat transfer plates 25a and 25b of the thermoelectric conversion element 30 of Example 1, an electromotive force of 1.9V is produced.

COMPARATIVE EXAMPLE

As a comparative example, a thermoelectric conversion element is fabricated by a known assembly method. Specifically, Bi—Te based p-type semiconductor plates and n-type semiconductor plates having a thickness of 1.5 mm are prepared. Then, a metallization layer is formed on both surfaces of these semiconductor plates by Ni plating. Furthermore, a solder plating layer mainly containing Sn—Bi is formed on the metallization layer. Thereafter, the plated p-type semiconductor plates and n-type semiconductor plates are cut into a size of 1 mm×1 mm by a dicing saw. Thus, a large number of p-type semiconductor blocks and n-type semiconductor blocks are obtained.

Figure 8A:
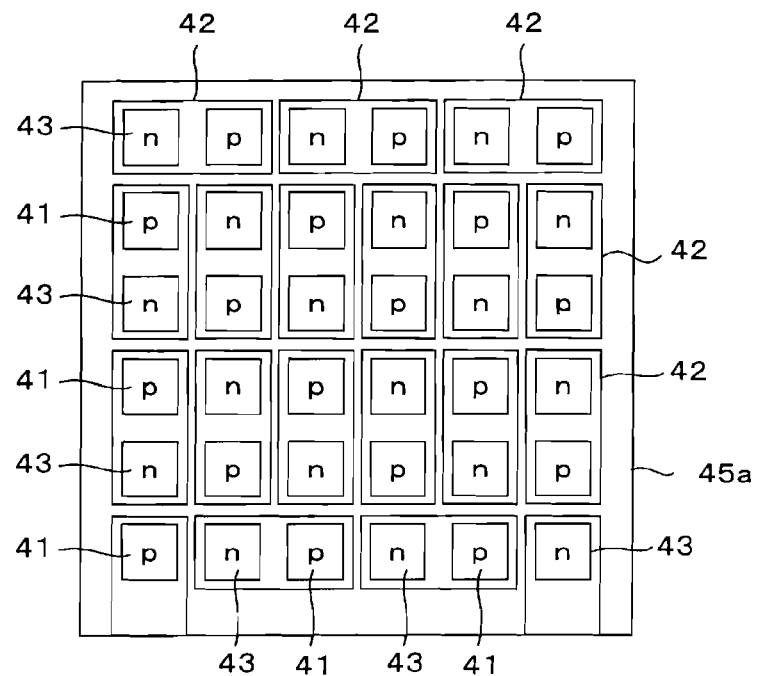
FIG. 8A is a plan view of semiconductor blocks of a thermoelectric conversion element according to a comparison example.

Meanwhile, two heat transfer plates each having a size of 1 cm×1 cm and made of alumina are prepared. Then, electrode patterns each formed of a Cu thin film having a predetermined shape are formed on the surfaces of the heat transfer plates. Thereafter, as illustrated in a plan view of FIG. 8A, the p-type semiconductor blocks 41 and the n-type semiconductor blocks 43 are arranged on electrode patterns 42 of a heat transfer plate 45a on one side while being positioned using a fixture. The distance between an adjacent pair of the p-type semiconductor blocks 41 and the n-type semiconductor blocks 43 is set to 0.5 mm. In this case, it is possible to arrange eighteen p-type semiconductor blocks 41 and eighteen n-type semiconductor blocks 43 on the heat transfer plate 45a.

Figure 8B:
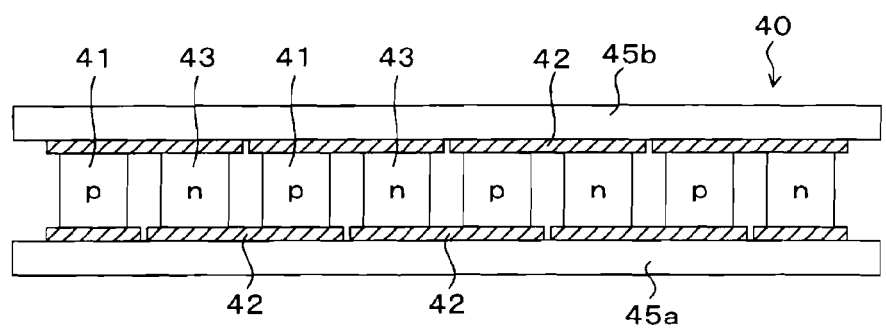
FIG. 8B is a cross-sectional view of the thermoelectric conversion element.

Next, as illustrated in a cross-sectional view of FIG. 8B, a heat transfer plate 45b on the other side is positioned and arranged on the semiconductor blocks 41 and 43 by use of a double side aligner. Then, the solder attached to the semiconductor blocks 41 and 43 is melted by heating. Thus, the semiconductor blocks 41 and 43 are bonded to the electrode patterns 42 of the heat transfer plates 45a and 45b. In the manner described above, a thermoelectric conversion element 40 according to Comparative Example is completed.

The thermoelectric conversion element 40 of Comparative Example has a size of 1 cm×1 cm with a thickness of 3 mm. In addition, the number of p-n pairs of the thermoelectric conversion element 40 is 18. When a temperature difference of 50° C. is generated between the heat transfer plates 45a and 45b of the thermoelectric conversion element 40 of Comparative Example, an electromotive force of 0.3V is produced.

(Second Embodiment)

FIGS. 9A to 9F are cross-sectional views illustrating the method of manufacturing a thermoelectric conversion element according to a second embodiment in the order of manufacturing steps.

Figure 9A:
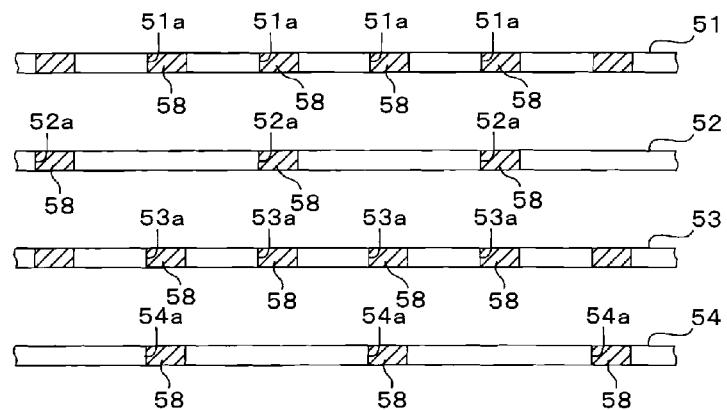
FIGS. 9A to 9F are cross-sectional views illustrating a method of manufacturing a thermoelectric conversion element according to a second embodiment.

First, as illustrated in FIG. 9A, a p-type semiconductor green sheet 51, an n-type semiconductor green sheet 53, and resin sheets (separator sheets) 52 and 54 are formed. In the first embodiment, the through holes 12a are formed in the resin sheet 12 and the through holes 14a are formed in the resin sheet 14, while no through holes are formed in the semiconductor green sheets 11 and 13 (refer to FIG. 3B). However, in the second embodiment, through holes 51a are formed in the semiconductor green sheet 51 and through holes 53a are formed in the semiconductor green sheet 53 in addition to through holes 52a formed in the resin sheet 52 and through holes 54a formed in the resin sheet 54 as in the case of the first embodiment. The through holes 51a and 53a are formed at positions corresponding to both of the through holes 52a of the resin sheet 52 and the through holes 54a of the resin sheet 54. The through holes 51a, 52a, 53a and 54a of the semiconductor green sheets 51 and 53 and of the resin sheets 52 and 54 are also filled with a conductive paste 58 as in the case of the first embodiment.

Figure 9B:
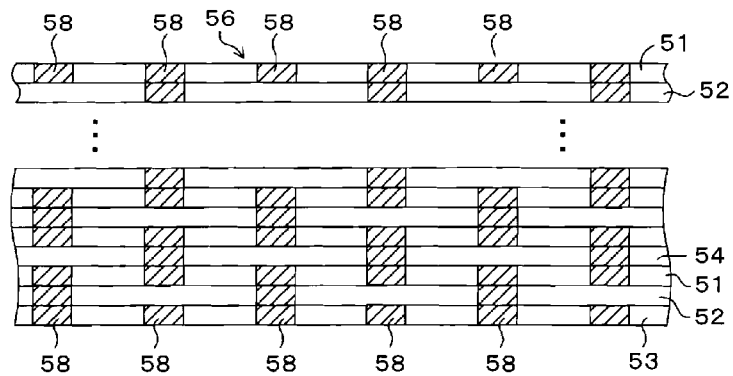

Next, as illustrated in FIG. 9B, the p-type semiconductor green sheet 51, the resin sheet 52, the n-type semiconductor green sheet 53, and the resin sheet 54 are repeatedly stacked in this order from above to form a laminated body 56. Thereafter, the stacked p-type semiconductor green sheets 51, resin sheets 52, n-type semiconductor green sheets 53 and resin sheets 54 are integrated into a single body by hot press.

Figure 9C:
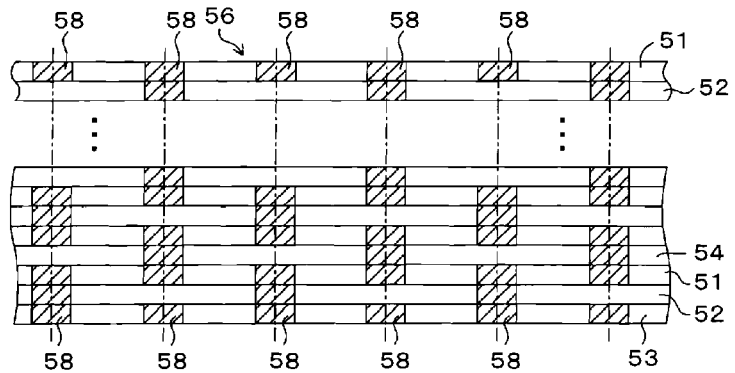
Figure 9D:
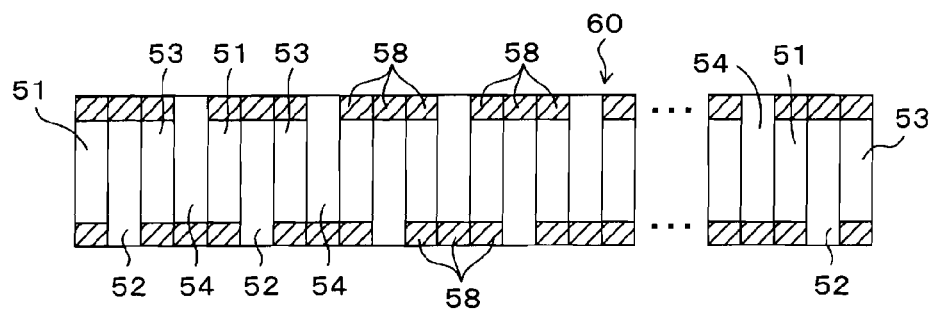

Next, as illustrated in FIG. 9C, the laminated body 56 is cut by a dicing saw, for example, to obtain a laminated body unit. The laminated body 56 is cut at the positions of the through holes 51a, 52a, 53a and 54a. FIG. 9D is a cross-sectional view of the laminated body unit 60 cut out from the laminated body 56. However, the height direction of the laminated body 56 in FIG. 9C is illustrated as the lateral direction in FIG. 9D.

Figure 9E:
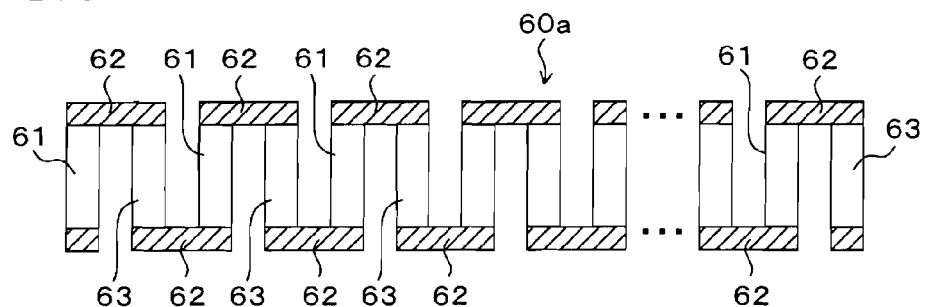

Next, the laminated body unit 60 is baked. With this baking process, the p-type semiconductor green sheets 51 become p-type semiconductor blocks 61 and the n-type semiconductor green sheets 53 become n-type semiconductor blocks 63, as illustrated in FIG. 9E. In addition, during this baking process, the conductive paste 58 filled in the through holes 51a, 52a, 53a and 54a is baked and integrated together and thus forms an electrode 62. Furthermore, during this baking process, the polymer forming the resin sheets 52 and 54 thermally decomposes and then is lost. Specifically, the laminated body unit 60 becomes a semiconductor block aggregate 60a of a structure in which the p-type semiconductor blocks 61 and the n-type semiconductor blocks 63 are alternately connected in series by the electrodes 62 each arranged at the upper or lower portion of the semiconductor block aggregate 60a.

Figure 9F:
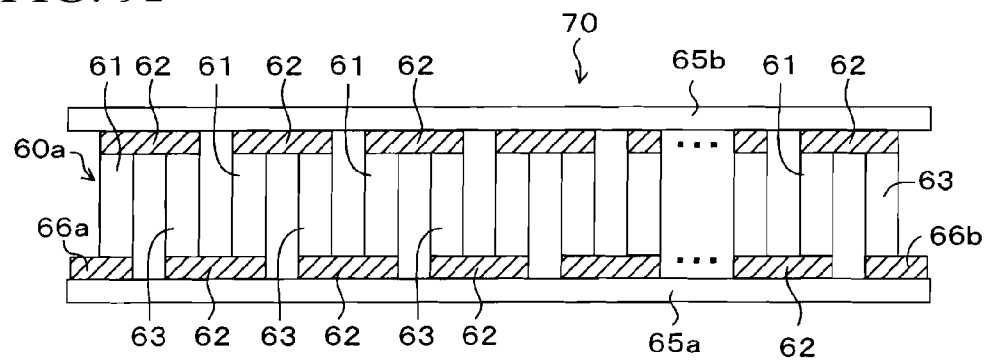

Next, as illustrated in FIG. 9F, heat transfer plates 65a and 65b are bonded respectively to the top and bottom portions of the semiconductor block aggregate 60a. In addition, extraction electrodes 66a and 66b are respectively formed at both edges of the semiconductor block aggregate 60a by use of a silver paste or the like. Thus, a thermoelectric conversion element 70 is completed.

The same effects as those obtained in the first embodiment may be obtained in this embodiment as well. Moreover, while the heat transfer plates 25a and 25b are bonded to the plurality of members having different materials (the semiconductor blocks 21 and 23 and the electrodes 22) in the first embodiment, the heat transfer plates 65a and 65b are bonded only to the single member (electrodes 62) in this embodiment. Thus, the thermoelectric conversion element 70 according to the second embodiment has an advantage in that it has higher reliability in terms of bonding between the semiconductor block aggregate 60a and the heat transfer plates 65a and 65b than the thermoelectric conversion element according to the first embodiment does.

(Third Embodiment)

FIGS. 10A to 10F are cross-sectional views illustrating the method of manufacturing a thermoelectric conversion element according to a third embodiment in the order of manufacturing steps. Note that, the components which are the same as those illustrated in FIGS. 9A to 9F are denoted by the same reference numerals in FIGS. 10A to 10F.

Figure 10A:
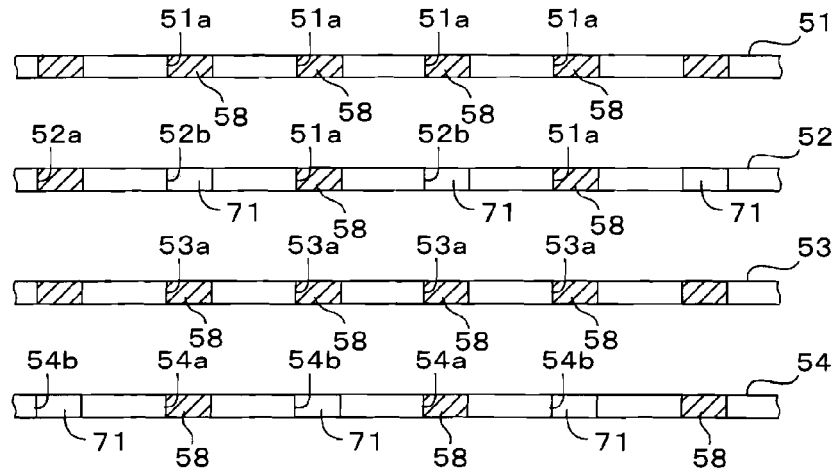
FIGS. 10A to 10F are cross-sectional views illustrating a method of manufacturing a thermoelectric conversion element according to a third embodiment.

First, as illustrated in FIG. 10A, a p-type semiconductor green sheet 51, an n-type semiconductor green sheet 53, and resin sheets 52 and 54 are formed. Through holes 52b are formed in the resin sheet 52, in addition to the through holes 52a. In addition, through holes 54b are formed in the resin sheet 54 in addition to the through holes 54a. The through holes 52b are formed along lines passing through the through holes 54a of the resin sheet 54, while the through holes 54b are formed along lines passing through the through holes 52a of the resin sheet 52.

The through holes 51a, 52a, 53a and 54a of the semiconductor green sheets 51 and 53 and of the resin sheets 52 and 54 are also filled with a conductive paste 58 as in the case of the second embodiment. In addition, the through holes 52b and 54b of the resin sheets 52 and 54 are filled with an insulating paste (borosilicate glass based paste or the like, for example) 71 which becomes glass after the baking process, for example.

Figure 10B:
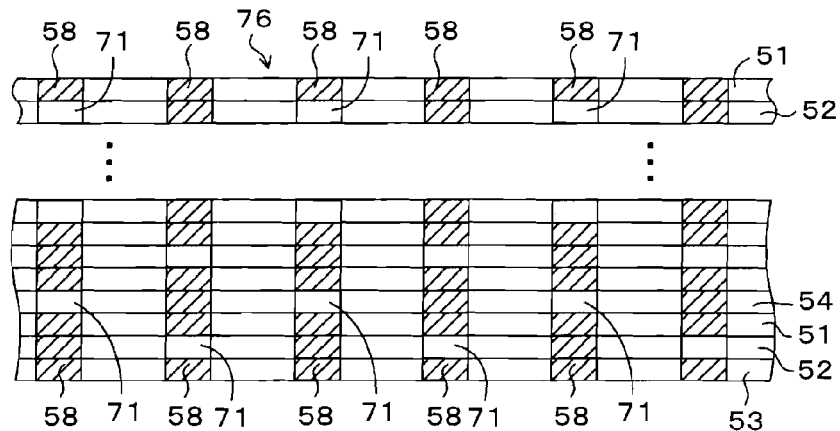

Next, as illustrated in FIG. 10B, the p-type semiconductor green sheet 51, the resin sheet 52, the n-type semiconductor green sheet 53, and the resin sheet 54 are repeatedly stacked in this order from above to form a laminated body 76. Thereafter, the stacked p-type semiconductor green sheets 51, resin sheets 52, n-type semiconductor green sheets 53, and resin sheets 54 are integrated into a single body by hot press.

Figure 10C:
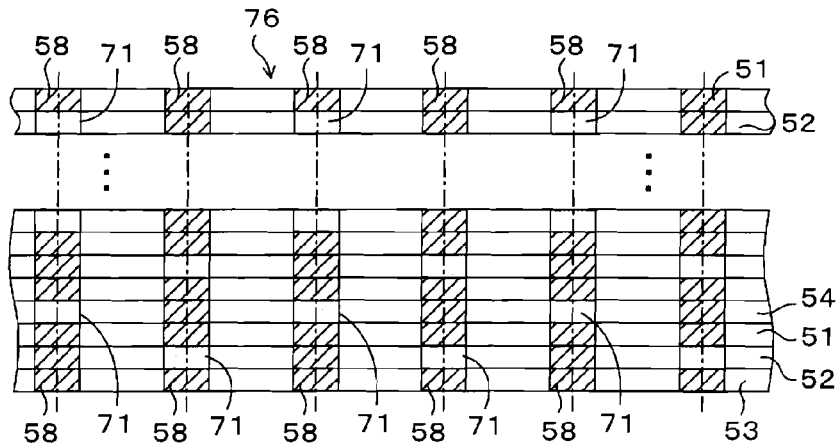
Figure 10D:
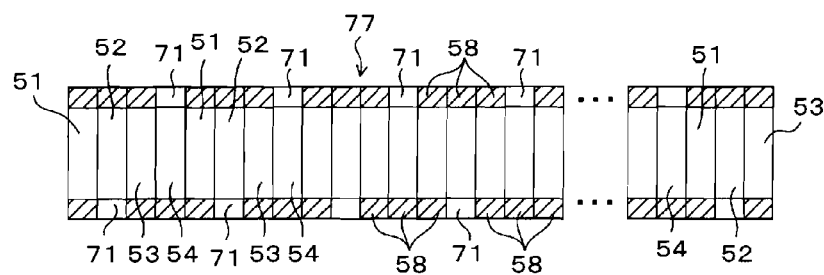

Next, as illustrated in FIG. 10C, the laminated body 76 is cut by a dicing saw, for example, to obtain a laminated body unit. The laminated body 76 is cut at the positions of the through holes 51a, 52a, 52b, 53a, 54a, and 54b. FIG. 10D is a cross-sectional view of a laminated body unit 77 cut out from the laminated body 76. However, the height direction of the laminated body 76 in FIG. 10C is illustrated as the lateral direction in FIG. 10D.

Figure 10E:
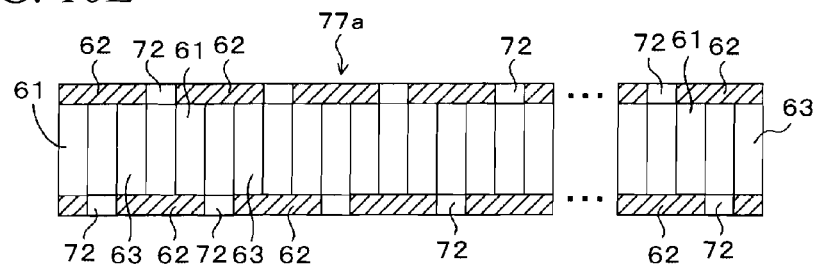

Next, the laminated body unit 77 is baked. With this baking process, the p-type semiconductor green sheets 51 become p-type semiconductor blocks 61 and the n-type semiconductor green sheets 53 become n-type semiconductor blocks 63, as illustrated in FIG. 10E. In addition, during this baking process, the conductive paste 58 filled in the through holes 51a, 52a, 53a and 54a is baked and integrated together and thus forms the electrode 62. Furthermore, the insulating paste 71 filled in the through holes 52b and 54b is baked and thus becomes an insulation spacer 72. Furthermore, during this baking process, the polymer forming the resin sheets 52 and 54 thermally decomposes and then is lost. Specifically, a laminated body unit 77 becomes a semiconductor block aggregate 77a of a structure in which the p-type semiconductor blocks 61 and the n-type semiconductor blocks 63 are alternately connected in series by the electrodes 62 arranged at the upper or lower portion of the semiconductor block aggregate 77a. However, the third embodiment is different from the second embodiment in that each of the insulating spacers 72 is interposed between the electrodes 62 adjacent to each other in the lateral direction as illustrated in FIG. 10E.

Figure 10F:
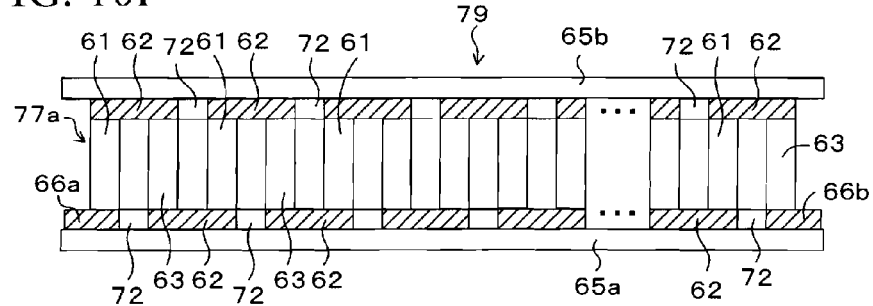

Next, as illustrated in FIG. 10F, heat transfer plates 65a and 65b are bonded respectively to the top and bottom portions of the semiconductor block aggregate 77a. Thus, a thermoelectric conversion element 79 is completed.

The thermoelectric conversion element 79 manufactured in this embodiment may bring about the same effects as those obtained by the thermoelectric conversion element in the second embodiment. In addition, the thermoelectric conversion element 79 of this embodiment has the structure in which the insulating spacers 72 are each arranged between the electrodes 62 adjacent to each other. Thus, the thermoelectric conversion element 79 of this embodiment has an advantage in that short circuit between the adjacent electrodes 62 may be prevented while the mechanical strength of the structure is improved.

Hereinafter, a result obtained by actually manufacturing a thermoelectric conversion element (thermoelectric generating element) by the third embodiment and then examining its electromotive force is described.

EXAMPLE 2

Firstly, $Ca_3Co_4O_9$ is prepared as the powder of p-type semiconductor material, and $Ca_{0.9}La_{0.1}MnO_3$ is prepared as the powder of n-type semiconductor material. Then, the powder of p-type semiconductor material, a binder resin (PVA based binder resin), a plasticizer (dibutyl phthalate), and a surfactant (polycarboxylic acid based surfactant) are mixed. Thus, p-type semiconductor green sheets 51 each having a thickness of 20 μm are formed by the doctor blade method.

Likewise, the powder of n-type semiconductor material, a binder resin (PVA based binder resin), a plasticizer (dibutyl phthalate), and a surfactant (polycarboxylic acid based surfactant) are mixed. Thus, n-type semiconductor green sheets 53 each having a thickness of 20 μm are formed by the doctor blade method.

Thereafter, the semiconductor green sheets 51 and 53 are subjected to a punching process by use of a punching press. Thus, the semiconductor green sheets 51 and 53 are each formed in a square shape with each side being 15 cm. During the punching processing step, the through holes 51a are formed in the semiconductor green sheet 51 and the through holes 53a are formed in the semiconductor green sheet 53 as illustrated in FIG. 10A. The through holes 51a and 53a are each formed with a width equal to 0.06 mm and a length equal to 12 mm and are arranged at a pitch of 3.45 mm in the width direction. Thereafter, the through holes 51a and 53a are filled by a screen printing method with a conductive paste 58 mainly containing Ag—Pd.

Meanwhile, a PVA resin and a plasticizer (dibutyl phthalate) are mixed. Thus, resin sheets 52 and 54 each having a thickness of 15 μm are formed by the doctor blade method. Thereafter, the resin sheets 52 and 54 are subjected to a punching process by use of a punching press. Thus, the resin sheets 52 and 54 each having a square shape with each side being 15 cm are formed. During this punching processing step, the through holes 52a and 52b are formed in the resin sheet 52, and the through holes 54a and 54b are formed in the resin sheet 54 as illustrated in FIG. 10A. Thereafter, by a screen printing method, the through holes 52a and 54a are filled with a conductive paste 58 while the through holes 52b and 54b are filled with the borosilicate glass based insulating paste 71.

The p-type semiconductor green sheets 51, the resin sheets 52, the n-type semiconductor green sheets 53, and the resin sheets 54 are stacked repeatedly in this order from above to form the laminated body 76 (refer to FIG. 10B). The number of the p-type semiconductor green sheets 51 and the number of the n-type semiconductor green sheets 53 are set to 224.

Next, the laminated body 76 is hot pressed for 30 minutes at a temperature of 120° C. to integrate the stacked p-type semiconductor green sheets 51, resin sheets 52, n-type semiconductor green sheets 53, and resin sheets 54 into a single body. Thereafter, the laminated body 76 is cut by a dicing saw. Thus, the laminated body unit 77 is obtained (refer to FIG. 10D).

Next, the laminated body unit 77 is heated in the atmosphere up to a temperature of 500° C. for 24 hours and is kept for 12 hours for degreasing thereafter. Subsequently, the laminated body unit 77 is baked in the atmosphere for one hour at a temperature of 950° C. Thus, the semiconductor block aggregate 77a having the following structure is obtained. In the structure, the p-type semiconductor blocks 61 and the n-type semiconductor blocks 63 are alternately connected in series by the electrodes 62 each arranged at the upper or lower portion of the semiconductor block aggregate 77a, and the insulating spacers 72 are each interposed between the electrodes 62 adjacent to each other in the lateral direction (refer to FIG. 10E).

Next, the heat transfer plates 65a and 65b made of alumina are bonded respectively to the top and bottom portions of the semiconductor block aggregate 77a by an adhesive (high thermal conductive adhesive). In addition, the extraction electrodes 66a and 66b to be connected respectively to the p-type semiconductor block 61 at one end of the semiconductor block aggregate 77a and the n-type semiconductor block 63 at the other end thereof are formed by a silver paste (refer to FIG. 10F). Thus, a thermoelectric conversion element 79 is completed.

The thermoelectric conversion element 79 of Example 2 fabricated in the aforementioned manner has a size of 1 cm×1 cm with a thickness of 3 mm, and the number of p-n pairs is 224. When a temperature difference of 50° C. is generated between the heat transfer plates 65a and 65b of the thermoelectric conversion element 79 of Example 2, an electromotive force of 3.6V is produced.

(Fourth Embodiment)

FIGS. 11A to 11F are cross-sectional views illustrating the method of manufacturing a thermoelectric conversion element according to a fourth embodiment in the order of manufacturing steps.

Figure 11A:
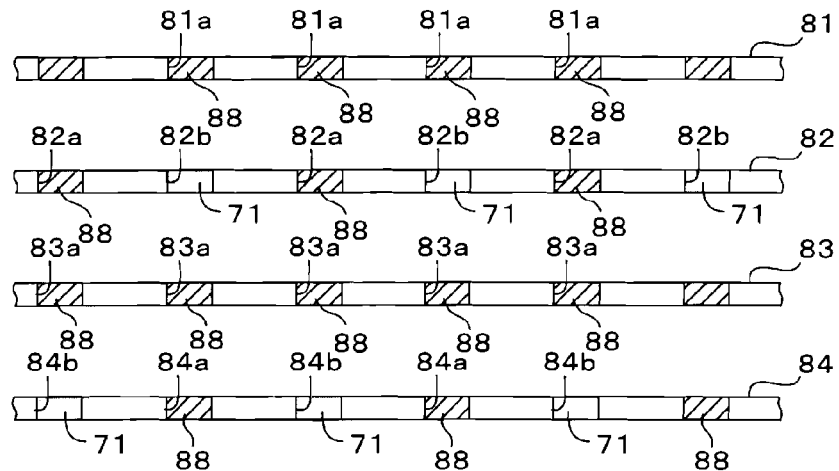
FIGS. 11A to 11F are cross-sectional views illustrating a method of manufacturing a thermoelectric conversion element according to a fourth embodiment.

First, as illustrated in FIG. 11A, a p-type semiconductor green sheet 81, an n-type semiconductor green sheet 83, and heat resistant sheets (separator sheets) 82 and 84 are formed. The semiconductor green sheets 81 and 83 are formed by mixing a powder of semiconductor material, a binder resin, a plasticizer, and a surfactant. Through holes 81a are formed in each of the semiconductor green sheets 81 and through holes 83a are formed in each of the semiconductor green sheets 83 as in the case of the second and third embodiments. Then, the through holes 81a and 83a are filled with a conductive paste 88.

Meanwhile, the heat resistance sheets 82 and 84 are formed of an insulating material which is not lost during the baking process. For example, a silica based ceramic fiber sheet may be used as the heat resistance sheets 82 and 84. The through holes 82a, 82b, 84a and 84b of the heat resistant sheets 82 and 84 are formed as in the case of the third embodiment. The through holes 82a and 84a are filled with a conductive paste 88 while the through holes 82b and 84b are filled with an insulating paste 71.

Figure 11B:
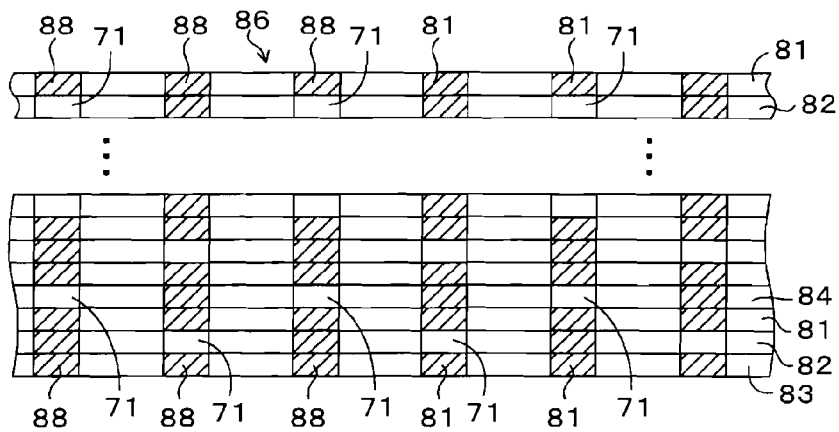

Next, as illustrated in FIG. 11B, the p-type semiconductor green sheet 81, the heat resistant sheet 82, the n-type semiconductor green sheet 83, and the heat resistant sheet 84 are repeatedly stacked in this order from above to form a laminated body 76. Thereafter, the stacked p-type semiconductor green sheets 81, heat resistant sheets 82, n-type semiconductor green sheets 83, and heat resistant sheets 84 are integrated into a single body by hot press.

Figure 11C:
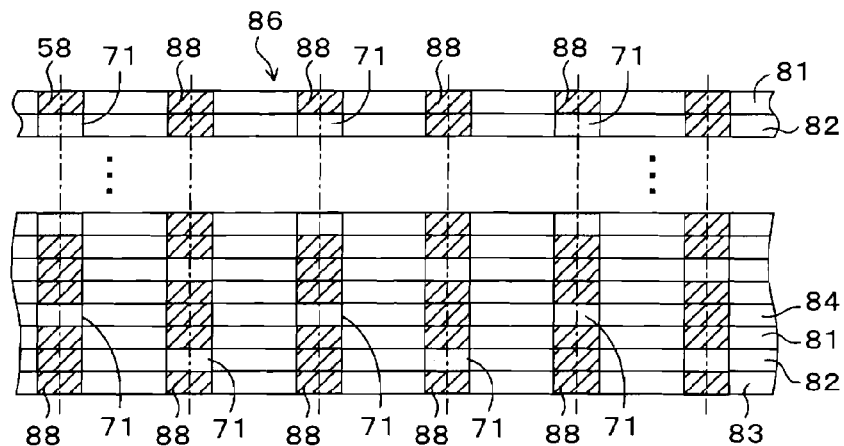
Figure 11D:
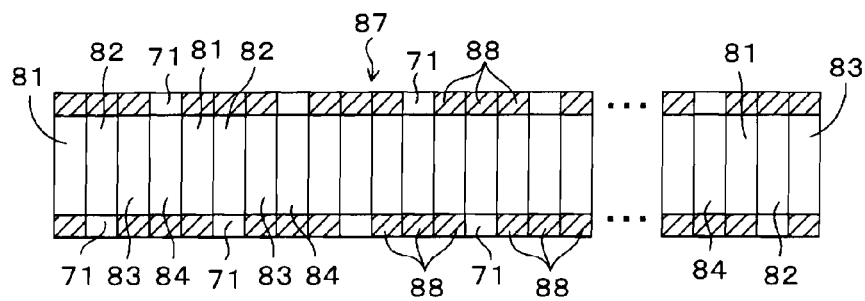

Next, as illustrated in FIG. 11C, the laminated body 86 is cut by a dicing saw, for example, to obtain a laminated body unit. The laminated body 86 is cut at the positions of the through holes 81a, 82a, 82b, 83a, 84a, and 84b. FIG. 11D is a cross-sectional view of a laminated body unit 87 cut out from the laminated body 86. However, the height direction of the laminated body 86 in FIG. 11C is illustrated as the lateral direction in FIG. 11D.

Figure 11E:
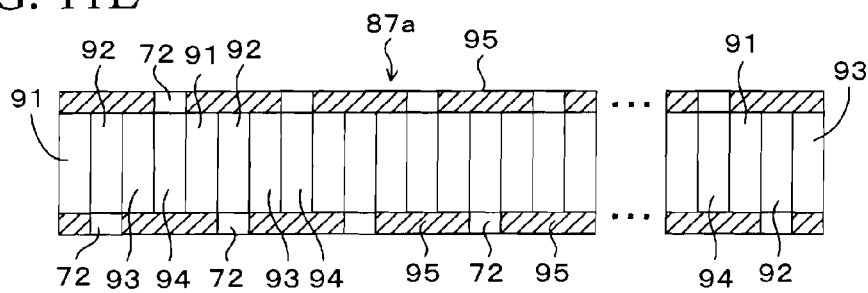

Next, the laminated body unit 87 is baked. With this baking process, the p-type semiconductor green sheets 81 become p-type semiconductor blocks 91 and the n-type semiconductor green sheets 83 become n-type semiconductor blocks 93, as illustrated in FIG. 11E. In addition, during this baking process, the conductive paste 88 filled in the through holes 81a, 82a, 83a and 84a is baked and integrated together and thus forms the electrode 95. Furthermore, the insulating paste 71 filled in the through holes 82b and 84b is baked and thus becomes an insulation spacer 72. Still further, the heat resistant sheets 82 and 84 are baked and thus become insulating blocks 92 and 94. Specifically, the laminated body unit 87 becomes a semiconductor block aggregate 87a of a structure in which the p-type semiconductor blocks 91 and the n-type semiconductor blocks 93 are alternately arranged with the insulating blocks 92 or 94 each interposed between a corresponding pair of the p-type and n-type semiconductor blocks 91 and 93. The semiconductor blocks 91 and 93 are alternately connected in series by the electrodes 95 each arranged at the upper or lower portion of the semiconductor block aggregate 87a.

Figure 11F:
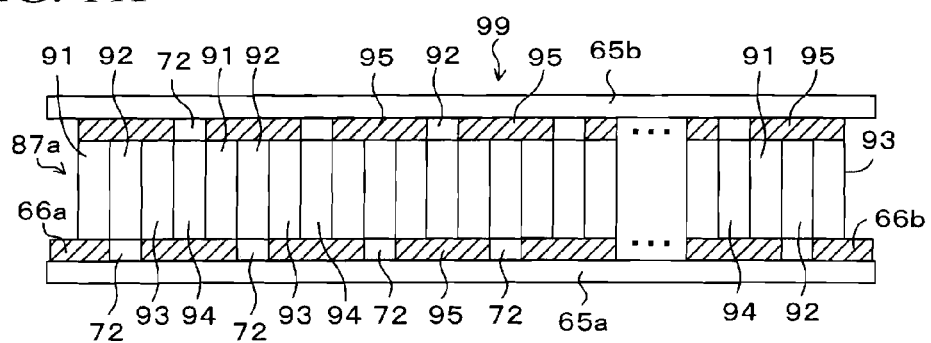

Next, as illustrated in FIG. 11F, heat transfer plates 65a and 65b are bonded respectively to the top and bottom portions of the semiconductor block aggregate 87a. Thus, a thermoelectric conversion element 99 is completed. The thermoelectric conversion element 99 of this embodiment may bring about the same effects as those obtained by the thermoelectric conversion element of the third embodiment.

Hereinafter, a result obtained by actually manufacturing a thermoelectric conversion element (thermoelectric generating element) by the fourth embodiment and then examining its electromotive force is described.

EXAMPLE 3

Firstly, $Ca_3Co_4O_9$ is prepared as the powder of p-type semiconductor material, and $Ca_{0.9}La_{0.1}MnO_3$ is prepared as the powder of n-type semiconductor material. Then, the powder of p-type semiconductor material, a binder resin (PVA based binder resin), a plasticizer (dibutyl phthalate), and a surfactant (polycarboxylic acid based surfactant) are mixed. Thus, p-type semiconductor green sheets 81 each having a thickness of 20 μm are formed by the doctor blade method.

Likewise, the powder of n-type semiconductor material, a binder resin (PVA based binder resin), a plasticizer (dibutyl phthalate), and a surfactant (polycarboxylic acid based surfactant) are mixed. Thus, n-type semiconductor green sheets 83 each having a thickness of 20 μm are formed by the doctor blade method.

Thereafter, the semiconductor green sheets 81 and 83 are subjected to a punching process by use of a punching press. Thus, the semiconductor green sheets 81 and 83 are each formed in a square shape with each side being 15 cm. During the punching processing step, the through holes 81a are formed in the semiconductor green sheet 81 and the through holes 83a are formed in the semiconductor green sheet 83 as illustrated in FIG. 11A. The through holes 81a and 83a are each formed with a width equal to 0.06 mm and a length equal to 12 mm and are arranged at a pitch of 3.06 mm in the width direction. Thereafter, the through holes 81a and 83a are filled by a screen printing method with a conductive paste 88 mainly containing Ag—Pd.

Meanwhile, a fiber sheet is prepared by forming a silica based ceramic fiber (having an average diameter being about 2 μm and average length being about 30 μm) in a sheet shape. The thickness of the fiber sheet is 15 μm. This fiber sheet is subjected to a punching processing step by use of a punching press. Thus, heat resistant sheets 82 and 84 each having a square shape with each side equal to 15 cm are obtained. During this punching processing step, through holes 82a and 82b are formed in the heat resistant sheet 82 and through holes 84a and 84b are formed in the heat resistant sheet 84 as illustrated in FIG. 11A. Thereafter, by a screen printing method, the through holes 82a and 84a are filled with a conductive paste 88 while the through holes 82b and 84b are filled with the borosilicate glass based insulating paste 71.

The p-type semiconductor green sheets 81, the heat resistant sheets 82, the n-type semiconductor green sheets 83, and the heat resistant sheets 84 are stacked repeatedly in this order from above to form the laminated body 86 (refer to FIG. 11B). The number of the p-type semiconductor green sheets 81 and the number of the n-type semiconductor green sheets 83 are set to 224.

Next, the laminated body 86 is hot pressed for 30 minutes at a temperature of 120° C. to integrate the stacked p-type semiconductor green sheets 81, heat resistant sheets 82, n-type semiconductor green sheets 83, and heat resistant sheets 84 into a single body. Thereafter, the laminated body 86 is cut by a dicing saw. Thus, the laminated body unit 87 is obtained (refer to FIG. 11D).

Next, the laminated body unit 87 is heated in the atmosphere up to a temperature of 500° C. for 24 hours and is kept for 12 hours for degreasing thereafter. Subsequently, the laminated body unit 87 is baked in the atmosphere for one hour at a temperature of 950° C. Thus, a semiconductor block aggregate 87a of a structure in which the p-type semiconductor blocks 91 and the n-type semiconductor blocks 93 are alternately arranged with the insulating blocks 92 or 94 each interposed between a corresponding pair of the p-type and n-type semiconductor blocks 91 and 93, and the semiconductor blocks 91 and 93 alternately connected in series by the electrodes 95. In this semiconductor block aggregate 87a, the insulating spacers 72 are each arranged between the electrodes 95 adjacent to each other in the lateral direction (refer to FIG. 11E).

Next, the heat transfer plates 65a and 65b made of alumina are bonded respectively to the top and bottom portions of the semiconductor block aggregate 97a by an adhesive (high thermal conductive adhesive). In addition, the extraction electrodes 66a and 66b to be connected respectively to the p-type semiconductor block 91 at one end of the semiconductor block aggregate 97a and the n-type semiconductor block 93 at the other end thereof are formed by a silver paste (refer to FIG. 11F). Thus, a thermoelectric conversion element 99 is completed.

The thermoelectric conversion element 99 of Example 3 fabricated in the aforementioned manner has a size of 1 cm×1 cm with a thickness of 3 mm, and the number of p-n pairs is 224. When a temperature difference of 50° C. is generated between the heat transfer plates 65a and 65b of the thermoelectric conversion element 99 of Example 3, an electromotive force of 3.6V is produced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

The invention claimed is:

1. A thermoelectric conversion element comprising:
   p-type semiconductor blocks and n-type semiconductor blocks alternately arranged in a first direction;
   a plurality of electrodes connecting the p-type semiconductor blocks and the n-type semiconductor blocks to each other; and
   a pair of heat transfer plates arranged to hold the p-type semiconductor blocks and the n- type semiconductor blocks therebetween in a second direction orthogonal to the first direction, wherein
   each of the plurality of electrodes is arranged between upper or lower portions of wall surfaces of the p-type semiconductor blocks and the n-type semiconductor blocks adjacent to each other, the wall surface of the p-type semiconductor block and the wall surface of the n-type semiconductor block facing each other, and the electrode being arranged only between the wall surface of the p-type semiconductor block and the wall surface of the n-type semiconductor block,
   an air gap is formed between the wall surface of the p-type semiconductor block and the wall surface of the n-type semiconductor block, the plurality of electrodes are arranged to allow a current to flow through the p-type semiconductor blocks and the n-type semiconductor blocks in the second direction, and a longitudinal direction of the p-type semiconductor blocks and the n-type semiconductor blocks coincides with a longitudinal direction of the electrodes, and an arrangement direction of the p-type semiconductor blocks and the n-type semiconductor blocks is orthogonal to the longitudinal direction of the electrodes.

2. The thermoelectric conversion element according to claim 1, wherein both of the p-type semiconductor blocks and the n-type semiconductor blocks are formed by baking green sheets formed by mixing a powder of semiconductor material, a binder resin, and a plasticizer.

3. The thermoelectric conversion element according to claim 1, wherein the p-type semiconductor blocks and the n-type semiconductor blocks are formed of an oxide based on semiconductor material.

* * * * *